United States Patent
Prabhu et al.

(10) Patent No.: US 6,873,024 B1
(45) Date of Patent: Mar. 29, 2005

(54) APPARATUS AND METHOD FOR WAFER LEVEL PACKAGING OF OPTICAL IMAGING SEMICONDUCTOR DEVICES

(75) Inventors: Ashok Prabhu, San Jose, CA (US); Shaw Wei Lee, Cupertino, CA (US)

(73) Assignee: Eastman Kodak Company, Rochester, NY (US)

( * ) Notice: Subject to any disclaimer, the term of this patent is extended or adjusted under 35 U.S.C. 154(b) by 36 days.

(21) Appl. No.: 10/217,341

(22) Filed: Aug. 9, 2002

Related U.S. Application Data

(63) Continuation-in-part of application No. 10/150,275, filed on May 15, 2002.

(51) Int. Cl.$^7$ ..................... H01L 31/0232; H01L 23/02; H01L 23/24
(52) U.S. Cl. ....................... 257/434; 257/433; 257/680; 257/687; 257/432
(58) Field of Search ................................. 257/432, 433, 257/434, 680, 687

(56) References Cited

U.S. PATENT DOCUMENTS

| | | | |
|---|---|---|---|
| 4,697,203 A | 9/1987 | Sakai et al. | |
| 5,734,156 A | 3/1998 | Dahlin et al. | |
| 5,818,094 A | 10/1998 | Matsuo | |
| 6,075,237 A | 6/2000 | Ciccarelli | |
| 6,117,193 A | 9/2000 | Glenn | |
| 6,225,692 B1 | 5/2001 | Hinds | 257/698 |
| 6,274,927 B1 * | 8/2001 | Glenn | 257/680 |
| 6,291,884 B1 | 9/2001 | Glenn et al. | |
| 6,384,472 B1 | 5/2002 | Huang | 257/680 |
| 6,483,179 B2 | 11/2002 | Iizima et al. | 257/680 |
| 6,492,699 B1 * | 12/2002 | Glenn et al. | 257/433 |
| 6,541,284 B2 | 4/2003 | Lam | 438/7 |

FOREIGN PATENT DOCUMENTS

| | | | | |
|---|---|---|---|---|
| KR | 2001007997 A | * | 11/2000 | H01L/23/28 |

OTHER PUBLICATIONS

Website http.//www.shellcase.com/pages/products.asp, downloaded Apr. 23, 2002, 2 pages.
Website http.//www.shellcase.com/pages/products-shellOP-process.asp, downloaded Apr. 23, 2002, 4 pages.
Website www.hanagroup.com/h_hmti.htm. "Hana Microdisplay Technologies, Inc.", downloaded Aug. 9, 2002.

* cited by examiner

*Primary Examiner*—Eddie Lee
*Assistant Examiner*—Samuel A. Gebremariam
(74) *Attorney, Agent, or Firm*—Beyer Weaver & Thomas LLP

(57) ABSTRACT

An apparatus and method for wafer level packaging of optical imaging die using conventional semiconductor packaging techniques. The method comprises forming spacing structures over imaging circuitry on a plurality of dice on a semiconductor wafer, attaching a transparent template on the spacing structures on the plurality dice on the semiconductor wafer, singulating the plurality of dice on the semiconductor wafer, and packaging the plurality of dice after being singulated from the wafer. The apparatus comprises a semiconductor wafer including a plurality of dice, each of the dice including imaging circuitry and bond pads. A translucent template is positioned over the semiconductor wafer. The translucent plate includes die cover regions configured to cover the imaging circuitry of the dice and recess regions to exposed the bond pads of the dice respectively. The resulting chip, after further packaging steps, includes the substrate, the semiconductor die having imaging circuitry and bond pads, the semiconductor die mounted onto the substrate and the transparent template positioned over the semiconductor die. The transparent template includes the a die cover region configured to be positioned over the imaging circuitry of the semiconductor die and recess regions to expose the bond pads of the semiconductor die.

14 Claims, 5 Drawing Sheets

APPARATUS AND METHOD FOR WAFER LEVEL PACKAGING OF OPTICAL IMAGING SEMICONDUCTOR DEVICES

RELATED APPLICATIONS

The present application is filed as a Continuation in Part of U.S. application Ser. No. 10/150,275 entitled "Apparatus and Method of Manufacturing a Package for an Optical Imaging Semiconductor Device", filed May 15, 2002, and incorporated by reference herein for all purposes.

FIELD OF THE INVENTION

The present invention relates generally to the packaging of semiconductor devices, and more particularly, to an apparatus and method of packaging optical imaging semiconductor devices.

BACKGROUND OF THE INVENTION

Optical imaging semiconductors, such as CMOS imaging sensors or Charge Couple Devices (CCDs), are capable of generating images from received light waves. Imaging semiconductor devices are usually encapsulated in a package that has a window made of glass, plastic or some other translucent material that allows light to impinge onto the light sensitive circuitry of the device.

One known type of packaging for optical semiconductor devices involves the use of a multi-piece ceramic package commonly called a leadless chip carrier (LCC). The package includes a ceramic substrate including a die attach area. An integrated circuit (IC) such as an imaging chip, is attached to the die attach area. A ceramic contact template having electrical contact pads is provided around the periphery of the package and surrounding the chip. Electrical connections, such a wire bonds, are formed between the chip and the pads on the contact template. The height of the contact template is approximately the same as that of the chip on the ceramic substrate. A ceramic spacer is provided on top of the contact template around the periphery of the package. A transparent lid, such as glass, is then mounted and hermetically sealed on top of the ceramic spacer. Recess regions, sometimes referred to as castellations, are formed on the exterior periphery of the package. The purpose of the castellations is to provide electrical traces from the contact pads of the contact template to the underside of the package. Contacts located on the underside of the package, such as solder balls, are used to electrically connect the chip inside the package to other electrical devices such as those on a printed circuit board. In alternative examples of an LCC package for optical chips, the substrate, contact template and the spacer can all be made of a plastic, such as epoxy.

The are a number of problems associated with the aforementioned package. One significant problem is maintaining the proper tolerances for the chip package. With imaging applications, the IC includes imaging circuitry. The imaging circuitry needs to be at a focal point with respect to the lens used to provide images onto the IC. With the multi-piece, multilevel package described above, it is relatively difficult to manufacture and assemble the package with the precise tolerances needed to assure that the IC is within the focal plane of the lens. Another problem with the aforementioned package is that the IC is susceptible contamination during assembly. The IC is attached to the substrate in an initial manufacturing step. Thereafter, numerous other steps are performed, such a wire bonding, attaching the contact template, and the spacer template, etc. During each of these steps, the IC is exposed to elements and dust particles that can readily contaminate the pixel area on the chip. Since the IC is protected from contamination only after the glass lid is attached to the package, there is a relatively high probability that the chip will be damaged, thereby reducing yields. Furthermore, ceramic packages are relatively expensive. They require assembly as single units and are generally not amenable to mass production manufacturing techniques. Ceramic LCC packages are therefore have reliability problems and are expensive.

An apparatus and method of wafer level packaging of optical imaging die using conventional semiconductor packaging techniques is therefore needed.

SUMMARY OF THE INVENTION

To achieve the foregoing, and in accordance with the purpose of the present invention, a method and apparatus for wafer level packaging of optical imaging die using conventional semiconductor packaging techniques is disclosed. The method comprises forming spacing structures over imaging circuitry on a plurality of dice on a semiconductor wafer, attaching a transparent template on the spacing structures on the plurality dice on the semiconductor wafer, singulating the plurality of dice on the semiconductor wafer, and packaging the plurality of dice after being singulated from the wafer. The apparatus comprises a semiconductor wafer including a plurality of dice, each of the dice including imaging circuitry and bond pads. A translucent template is positioned over the semiconductor wafer. The translucent plate includes die cover regions configured to cover the imaging circuitry of the dice and recess regions to exposed the bond pads of the dice respectively. The resulting chip, after further packaging steps, includes the substrate, the semiconductor die having imaging circuitry and bond pads, the semiconductor die mounted onto the substrate and the transparent template positioned over the semiconductor die. The transparent template includes the a die cover region configured to be positioned over the imaging circuitry of the semiconductor die and recess regions to expose the bond pads of the semiconductor die.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

In the aforementioned parent application Ser. No. 10/150,275, an apparatus and method for packaging optical imaging die on a lead frame using conventional semiconductor packaging techniques is disclosed. In contrast, the present invention relates to wafer level packaging of optical imaging die using conventional semiconductor packaging techniques.

Figure 1:
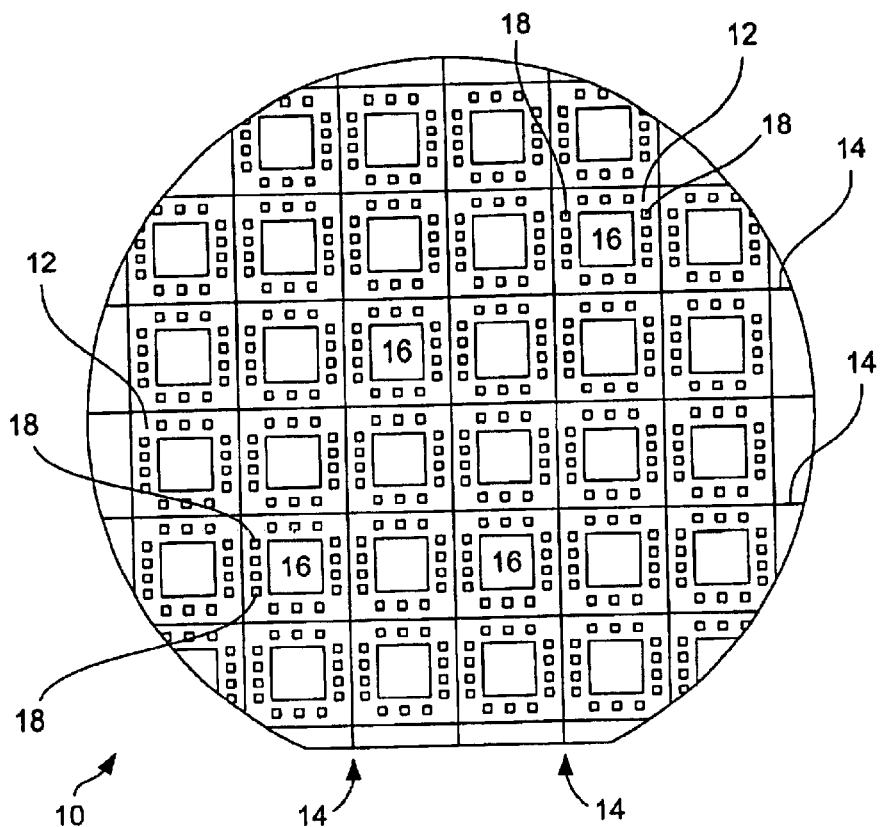
FIG. 1 is top view of a semiconductor wafer of optical imaging dice.

Referring to FIG. 1, a top view of a semiconductor wafer containing optical imaging dice is shown. The wafer 10 includes a plurality of individual die 12 separated by horizontal and vertical scribe lines 14. Each individual die 12 includes imaging circuitry 16 (sometimes referred to as the "pixel area"), generally located in the center of the die. A plurality of bond pads 18 are provided around the imaging circuitry 16 at the periphery of each die 12.

Figure 2:
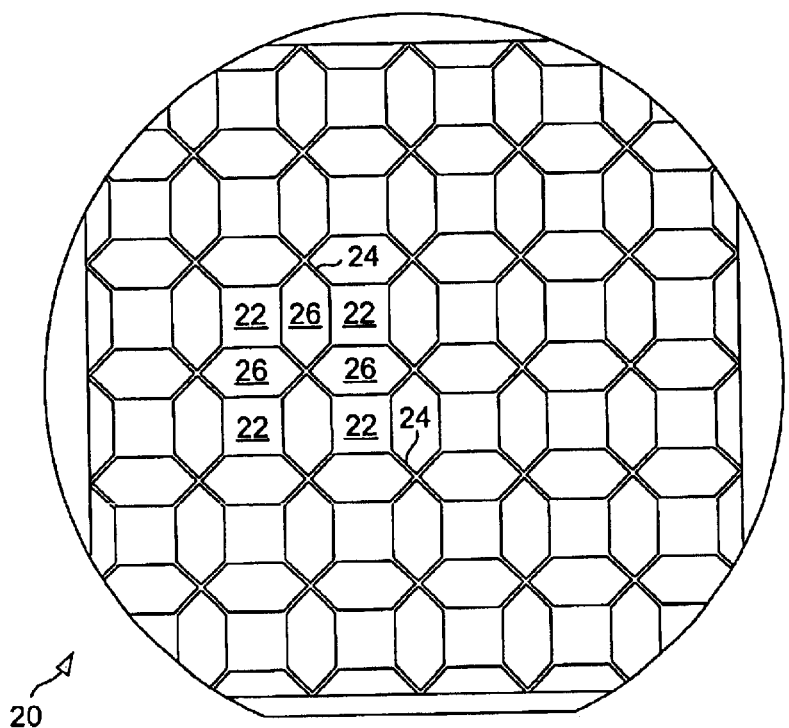
FIG. 2 is a top view of a transparent template that is configured to be laminated onto the semiconductor wafer of FIG. 1 according to the present invention.

Referring to FIG. 2, a top view of a transparent template 20 that is configured to be laminated onto the semiconductor wafer 10 is shown. The template 20 has the same general shape as the wafer 10 and includes die cover regions 22 and tie bar regions 24. The tie bars 24 are provided to hold the die cover regions 22 together. Recess regions 26 are defined by the space between the die cover regions 22 and the tie bars 24. According to various embodiments of the invention, the template is made of glass, plastic or any other type of translucent material that is transparent to light. For example, the transparent template may be made from one of the following: Borofloat(™), Forturan(™) or a material type such as borosilicate glass. If a clear plastic is used, materials such as acrylic or polycarbonate may be suitable.

Figure 3:
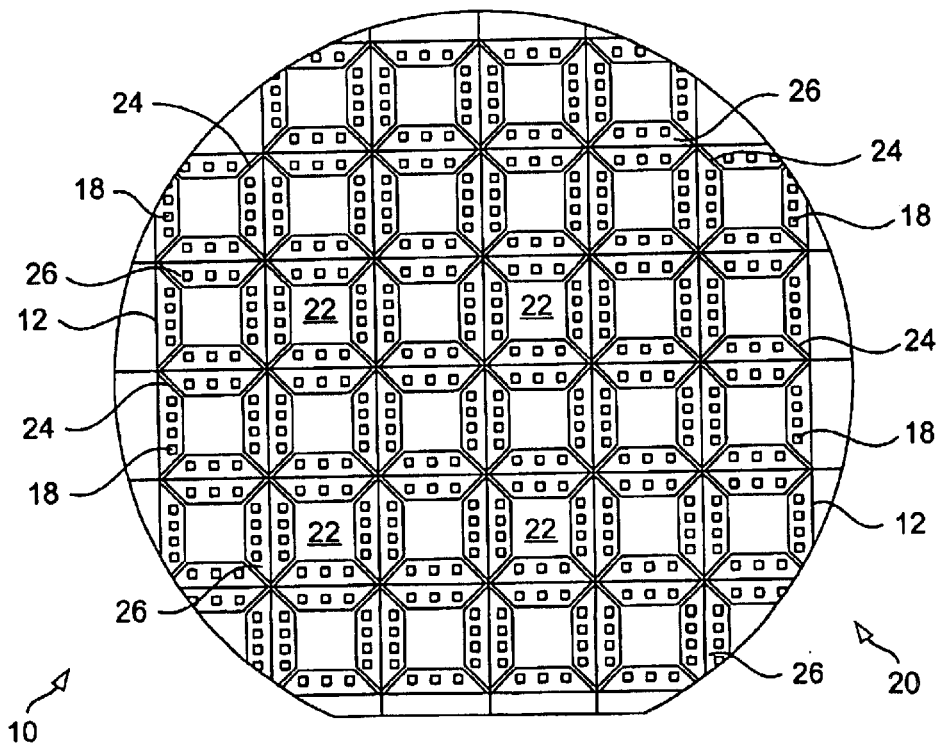
FIG. 3 is a top view of the transparent template of FIG. 2 laminated onto the semiconductor die of FIG. 1 according to the present invention.

Referring to FIG. 3, a top view of the transparent template 20 laminated onto the semiconductor wafer 10 is shown. As is evident in the figure, the die cover regions 22 cover the imaging circuitry 16 of each die 12 on the wafer 10. Further, the recess regions 26 are positioned over the wafer 10 such that the bond pads 18 of each die 12 are not covered and are exposed through the recess regions 26 of the template 20.

Figure 4:
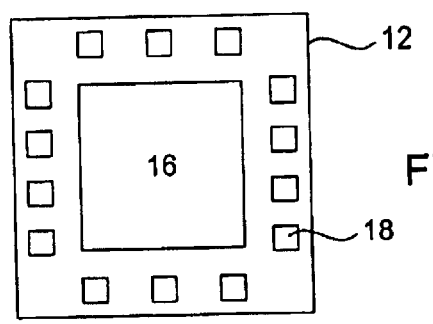
FIG. 4 is a top view of one of the die on the semiconductor wafer of FIG. 1.

Referring to FIG. 4, one of the die 12 on wafer 10 is shown for the sake of illustration. As is illustrated in this figure, the plurality of bond pads 18 are provided around the imaging circuitry 16 of the die 12. Before the template 20 is applied, the dice 12 on the wafer 10 are prepared to receive the template 20. According to various embodiments, the template 20 may be secured in a number of different ways as described below. It should be noted that with FIGS. 4, 5A and 5B, only a single die is shown for simplicity. The techniques described below, however, are apply to all the dice 12 on the wafer 10.

Figure 5A:
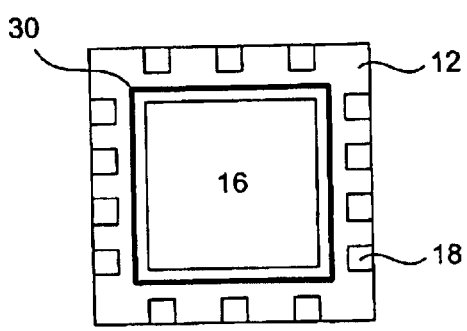
FIGS. 5A and 5B are top views of alternative embodiments of preparing a die on the semiconductor wafer to receive the transparent template according to the present invention.

Referring to FIG. 5A, a spacing structure 30 formed on a die 12 of wafer 10 is shown according one embodiment of the present invention. With this embodiment, the spacing structure 30 is formed above the imaging circuitry 16 by dispensing a bead of epoxy resin around the periphery of the imaging circuitry 16. The spacing structure 20 may range in height, for example from 50 microns to 150 microns. It should be noted, however, that this range is not definitive and that the actual height may vary. With certain applications, the height can be greater than 150 microns or less than 50 microns. For example, the height may range from less than 10 microns to 200 microns or more. In one specific embodiment, a height of 100 microns is used. The epoxy resin used to form the bead can be any type of commercially available resin such as that available from Sumitomo Corporation of Japan. It should be noted that for the sake of simplicity, only one die 12 is shown in the FIG. 5A. Typically, the spacing structure 30 would be formed on all the dice 12 of the wafer 10 before the template 20 is laminated onto the wafer 10.

Figure 5B:
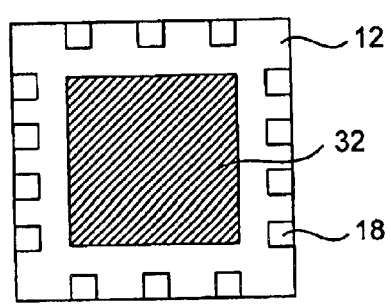

Referring to FIG. 5B, another embodiment of a spacing structure 32 formed on the die 12 is shown. With this embodiment, the spacing structure 32 is formed by dispensing a layer of clear epoxy over the imaging circuitry 16 on the surface of the die 12. The spacing structure 32 may range in height, for example from 50 to 150 microns. It should be noted, however, that this range is not definitive and that the actual height may vary. With certain applications, the height can be greater than 150 microns or less than 50 microns. For example, the height may range from less than 10 microns to 200 microns or more. In one specific embodiment, a height of 100 microns is used. The clear epoxy resin used to form the spacing structure 22 can be any type of commercially available type resin. Again, it should be noted that the spacing structure 32 would be formed on all the dice 12 of the wafer 10 before the template 20 is laminated onto the wafer 10.

It should be noted that with the two embodiments described above, the spacing structure 30 or 32 is first formed on the wafer 10 before the template 20 is laminated thereon. In alternative embodiments, however, the spacing structures 30 and 332 could first be formed on the template 20 and then laminated onto the wafer 10.

After the template 20 is laminated onto the wafer 10, the dice 12 are singulated. This is accomplished using standard wafer sawing techniques along the scribe lines 14. When the wafer 10 is cut, the tie bars 24 that held the individual die cover regions 22 together before the template 20 was laminated to the wafer 10 are separated. Once the dice 12 have been singulated, they are packaged using standard semiconductor packaging techniques. A detailed discussion of the packaging sequence of the present invention is described below with respect to FIGS. 6 through 10.

Figure 6:
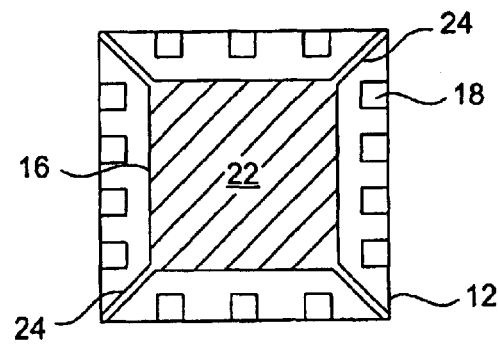
FIG. 6 is a top view of a singulated die.

Referring to FIG. 6, a top view of a singulated die 12 is shown. As is illustrated in the figure, the die cover region 22 is position over and covers the imaging circuitry 16 (not shown) on the die 12. Since the die cover region is made of a transparent material, light can impinge on the pixel area of the imaging circuitry 16. The bond attach pads 18 are also exposed on the surface of the die 12 through the recess regions 26 of the template 20.

Figure 7:
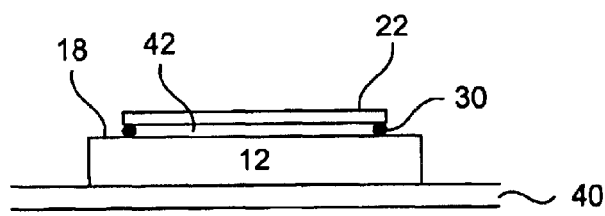
FIG. 7 is a cross section of the optical imaging semiconductor device attached to a substrate according to the present invention.

Referring to FIG. 7, a cross section of a singulated die 12 attached to a substrate 40 is shown. The substrate 40 can be a variety of different types of substrates, including but not limited to a lead frame, a laminated substrate, a ceramic substrate, or tape for example. The die 12 is attached to any one of these types of substrates using conventional semiconductor packaging techniques. Although not shown in this figure, the substrate 40 includes contacts usually located on the bottom surface of the substrate. The spacing structure 30 of FIG. 5A formed by the bead of epoxy resin around the periphery of the imaging circuitry is visible in this cross section. A gap 42 is therefore present between the die cover region 22 and the surface of the die 12. Although not illustrated, the cross section of the die of FIG. 5B would essentially be the same except that the gap 42 would be filled with the clear epoxy resin of the spacing structure 32.

Figure 8:
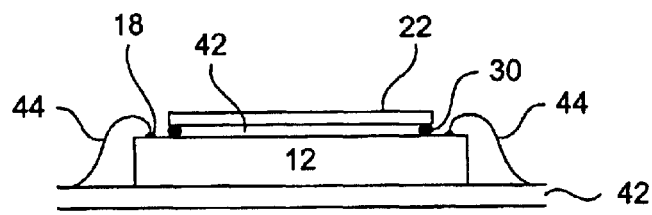
FIG. 8 is a cross section of the optical imaging semiconductor device with wire bonds formed between the device and the substrate according to the present invention.

Referring to FIG. 8, a cross section of the die 12 with wire bonds 44 formed between the bond pads 18 and contacts formed on the substrate 40 is shown. According to various embodiments of the invention, the wire bonds 44 can be formed using copper, silver, gold, or any other type of conductive wire. Further, the electrical connections between the die 12 and the substrate 40 do not necessarily have to be formed using wire bonds. Rather, any type of contact such as bumps, tape automated bonding, etc. may be used.

Figure 9:
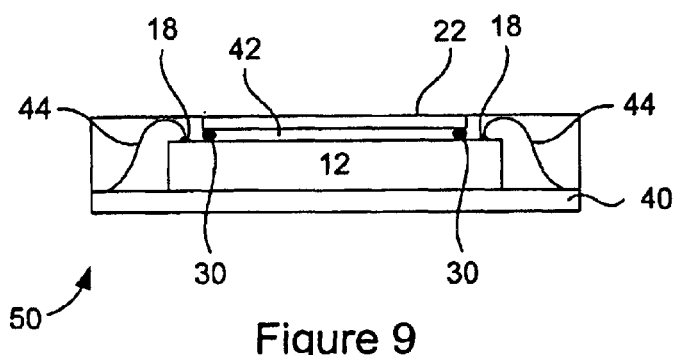
FIG. 9 is a cross section of the optical imaging semiconductor device encapsulated into a package according to the present invention.

Referring to FIG. 9, a cross section of the die 12 encapsulated into a package 50 according to the present invention is shown. Specifically the die 12, substrate 40 and wire bonds 44 (or any other type of connection) are encapsulated with a standard packaging material such as epoxy. The resulting package device 50 may be formed using any one of a variety of conventional encapsulation techniques such as transfer molding, film assisted molding or glob packaging. The top surface of the package 50 is flat with the die cover region 22 being flush with the top surface of the package 50. Thus a "window is formed in the package above the imaging circuitry 16 on the die 12. According to various embodiments, the encapsulant material may include silica filled epoxy, clear epoxy, polyimides, etc.

Figure 10:
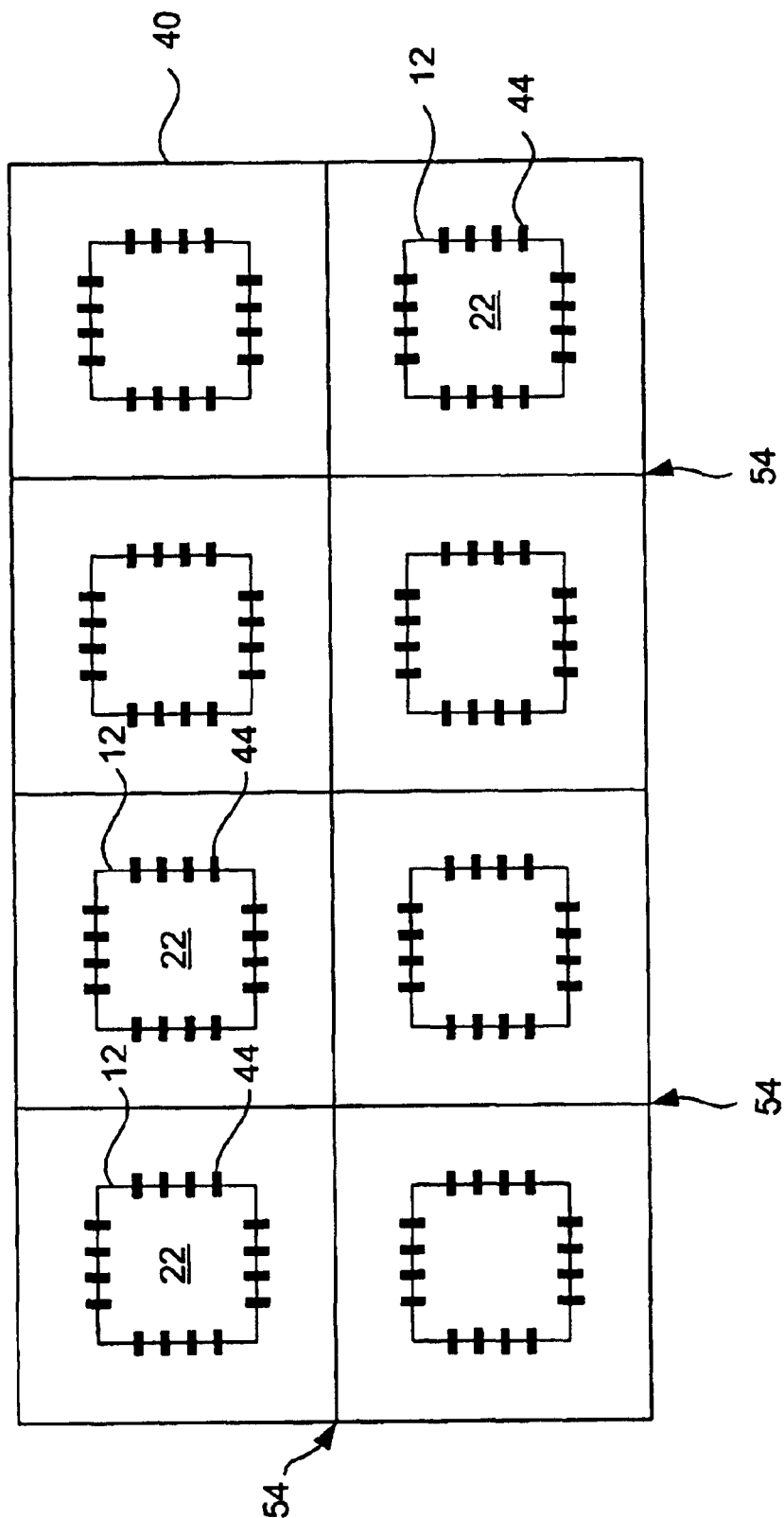
FIG. 10 is a top down view of a number of die attached to a lead frame or laminate prior to encapsulation according to the present invention.

In various embodiments of the invention, many dice 12 can be attached to a substrate 40 for packing in parallel as opposed to packaging one die at a time. Referring to FIG. 10, a top down view of a number of die 12 attached to a substrate 40 is shown. As noted above, the substrate can be any type of substrate such as a lead frame, a laminated substrate, a ceramic substrate, or tape for example. After the dice 12 are attached to the substrate 40, the wire bonds 44 or other contacts are formed between the dice 12 and the contacts on the substrate. Thereafter, the substrate 40 is placed into a mold and the mold is injected with a packaging material such as epoxy. In alternative embodiments, a packaging material such as epoxy can be globbed onto the dice 12 on the substrate 40. In either case, once the individual dice 12 are encapsulated, they are singulated by sawing or cutting the substrate 40 along saw street lines.

Figure 11:
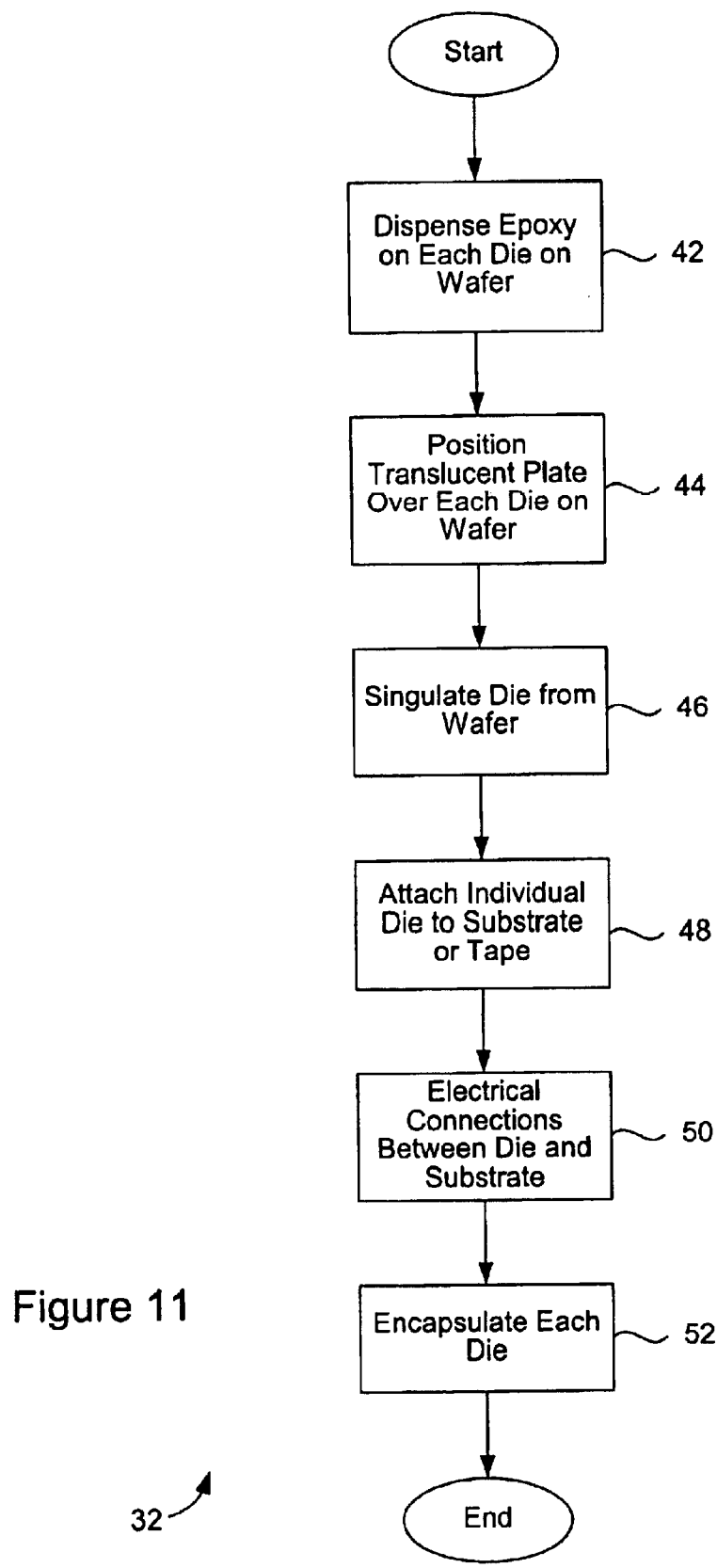
FIG. 11 is a flow chart illustrating the sequence for wafer level packaging of optical imaging semiconductor devices according to the present invention.

FIG. 11 is a flow chart 70 illustrating the sequence for wafer level packaging of optical imaging semiconductor devices according to the present invention. In the initial step, the spacing structure 30 or 32 is formed on each die 12 of the wafer (box 72). Thereafter the template 22 is positioned on and laminated to the wafer 10, 12 (box 74). In the next step, the dice 12 are singulated from the wafer 10 (box 76). The individual die 12 are then subsequently attached to a substrate or tape (box 78). Electrical connections such as wire bonds are then formed between the bond pads 18 on the die 12 and the substrate (box 80) before the die is encapsulated into a package (box 72).

The present invention therefore provides a number of advantages. Foremost, the spacing structure 30 or 32 can readily be dispensed at a desired height. Thus the tolerance of the gap 42 height between the die cover region 22 of the translucent template 20 positioned over the imaging circuitry of the die 12 is easy to control during packaging. Further, the translucent template 20 is attached to the die 12 early in the packaging sequence. The imaging circuitry of the die 12 is therefore protected from contamination during subsequent packaging steps. Finally, the present invention takes advantage of standard semiconductor packaging techniques, which helps reduce costs, increase yields, and improves reliability.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. An apparatus, comprising:

a semiconductor wafer including a plurality of dim each of the dice including image circuitry and bond pads; and a translucent template positioned onto the semiconductor wafer, the translucent template including die cover regions configured to cover the imaging circuitry of the dice and recess regions to expose the bond pads of the dice respectively and tie bars configured to hold the die cover regions of the template together.

2. The apparatus of claim 1, further comprising a spacing structure formed between the dice of the wafer and the translucent template.

3. The apparatus of claim 2, wherein the spacing structure has a height less than 200 microns.

4. The apparatus of claim 2, wherein the spacing structure comprises one of the following types of spacing stores: a bead of epoxy, or a layer of epoxy.

5. An apparatus comprising:

a substrate;

a semiconductor die having imaging circuitry and bond pads, the semiconductor die mounted onto the substrate; and a transparent template positioned over the semiconductor die, the transparent template having a die cover region configured to be positioned over the imaging circuitry of the semiconductor die and recess regions to expose the bond pads of the semiconductor die, the transparent template further including tie bars separating the die cover region and the recess regions.

6. The apparatus of claim 5, further comprising a spacer structure between the semiconductor die and the transparent template.

7. The apparatus of claim 6, wherein the spacing structure has a height ranging from 50 microns to 150 microns.

8. The apparatus of claim 5, wherein the spacing structure comprises one of the following types of spacing structures: a bead of epoxy, or a layer of epoxy.

9. The apparatus of claim 5, wherein the substrate comprises one of the following types of substrates: a lead frame; a laminated substrate; a ceramic substrate; or tape.

10. The apparatus of claim 5, further comprising wire bonds formed between the bonds pads of the semiconductor die and contacts of the substrate.

11. The apparatus of claim 5, further comprising a package to encapsulate the substrate, semiconductor die and the transparent template such that light can impinge on the imaging circuitry of the semiconductor die through the transparent template when encapsulated in the package.

12. The apparatus of claim 11, wherein the package is made of epoxy.

13. The apparatus of claim 2, wherein the spacing structure has a height greater than 10 microns.

14. The apparatus of claim 2, wherein the spacing structure has a height ranging from 50 microns to 150 microns.

* * * * *

UNITED STATES PATENT AND TRADEMARK OFFICE
CERTIFICATE OF CORRECTION

PATENT NO.     : 6,873,024 B1
DATED          : March 29, 2005
INVENTOR(S)    : Ashok Prabhu et al.

It is certified that error appears in the above-identified patent and that said Letters Patent is hereby corrected as shown below:

<u>Column 6,</u>
Line 14, after "plurality of" delete "dim" and insert -- dice --.
Line 28, after "types of spacing" delete "stores" and insert -- structure --.

Signed and Sealed this

Eighth Day of November, 2005

JON W. DUDAS
*Director of the United States Patent and Trademark Office*